United States Patent
Lin et al.

(10) Patent No.: US 10,453,811 B2
(45) Date of Patent: Oct. 22, 2019

(54) POST PASSIVATION INTERCONNECT AND FABRICATION METHOD THEREFOR

(71) Applicant: TAIWAN SEMICONDUCTOR MANUFACTURING COMPANY, LTD., Hsinchu (TW)

(72) Inventors: Yi-An Lin, Hsinchu (TW); Alan Kuo, Hsinchu (TW); C. C. Chang, Hsinchu (TW); Yu-Lung Shih, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 15/582,955

(22) Filed: May 1, 2017

(65) Prior Publication Data
US 2018/0151520 A1    May 31, 2018

Related U.S. Application Data

(60) Provisional application No. 62/427,786, filed on Nov. 29, 2016.

(51) Int. Cl.
| H01L 23/00 | (2006.01) |
| H01L 23/525 | (2006.01) |
| H01L 23/528 | (2006.01) |
| H01L 21/768 | (2006.01) |

(52) U.S. Cl.
CPC ............ *H01L 24/02* (2013.01); *H01L 23/525* (2013.01); *H01L 23/5283* (2013.01); *H01L 21/76885* (2013.01); *H01L 2224/024* (2013.01); *H01L 2224/0235* (2013.01); *H01L 2224/0239* (2013.01); *H01L 2224/02313* (2013.01); *H01L 2224/02317* (2013.01); *H01L 2224/02351* (2013.01); *H01L 2224/02373* (2013.01); *H01L 2224/0401* (2013.01); *H01L 2224/05008* (2013.01); *H01L 2224/05541* (2013.01); *H01L 2224/131* (2013.01); *H01L 2224/13024* (2013.01); *H01L 2224/13147* (2013.01); *H01L 2924/01013* (2013.01); *H01L 2924/01029* (2013.01); *H01L 2924/01074* (2013.01); *H01L 2924/01079* (2013.01); *H01L 2924/05042* (2013.01); *H01L 2924/14* (2013.01); *H01L 2924/3511* (2013.01)

(58) Field of Classification Search
None
See application file for complete search history.

(56) References Cited

U.S. PATENT DOCUMENTS

| 2004/0192056 A1* | 9/2004 | Iijima | H01J 37/32935 438/706 |
| 2006/0038291 A1* | 2/2006 | Chung | H01L 23/3114 257/738 |
| 2012/0007230 A1* | 1/2012 | Hwang | H01L 24/03 257/737 |
| 2013/0099371 A1* | 4/2013 | Cheng | H01L 24/13 257/737 |

* cited by examiner

*Primary Examiner* — Herve-Louis Y Assouman
(74) *Attorney, Agent, or Firm* — Hauptman Ham, LLP

(57) ABSTRACT

A method of manufacturing a semiconductor structure. The method includes depositing a conductive material over a substrate, and removing a portion of the conductive material to form a conductive structure having a barrel shape. A width of a body portion of the conductive structure is greater than a width of an upper portion and a width of a bottom portion of the conductive structure.

20 Claims, 5 Drawing Sheets

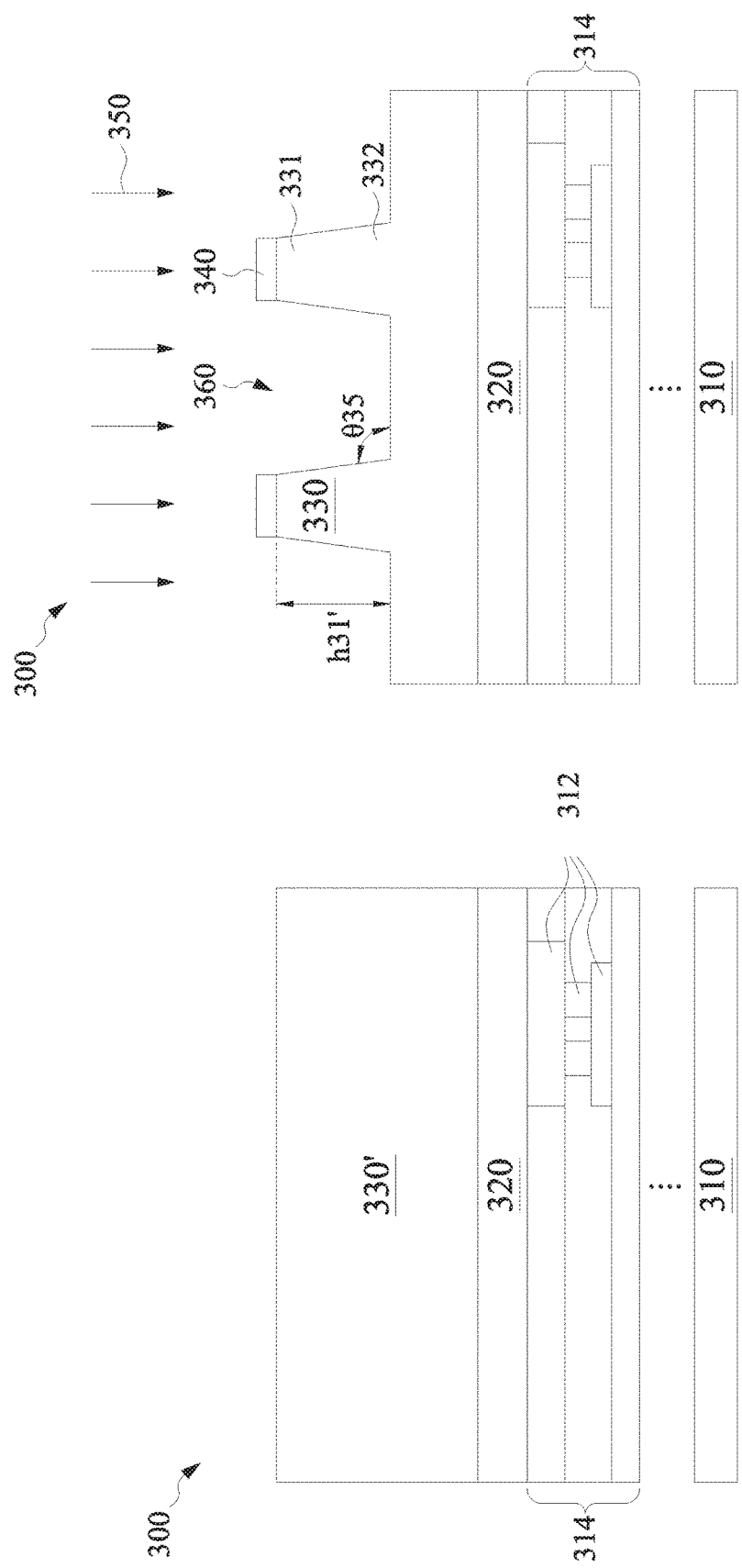

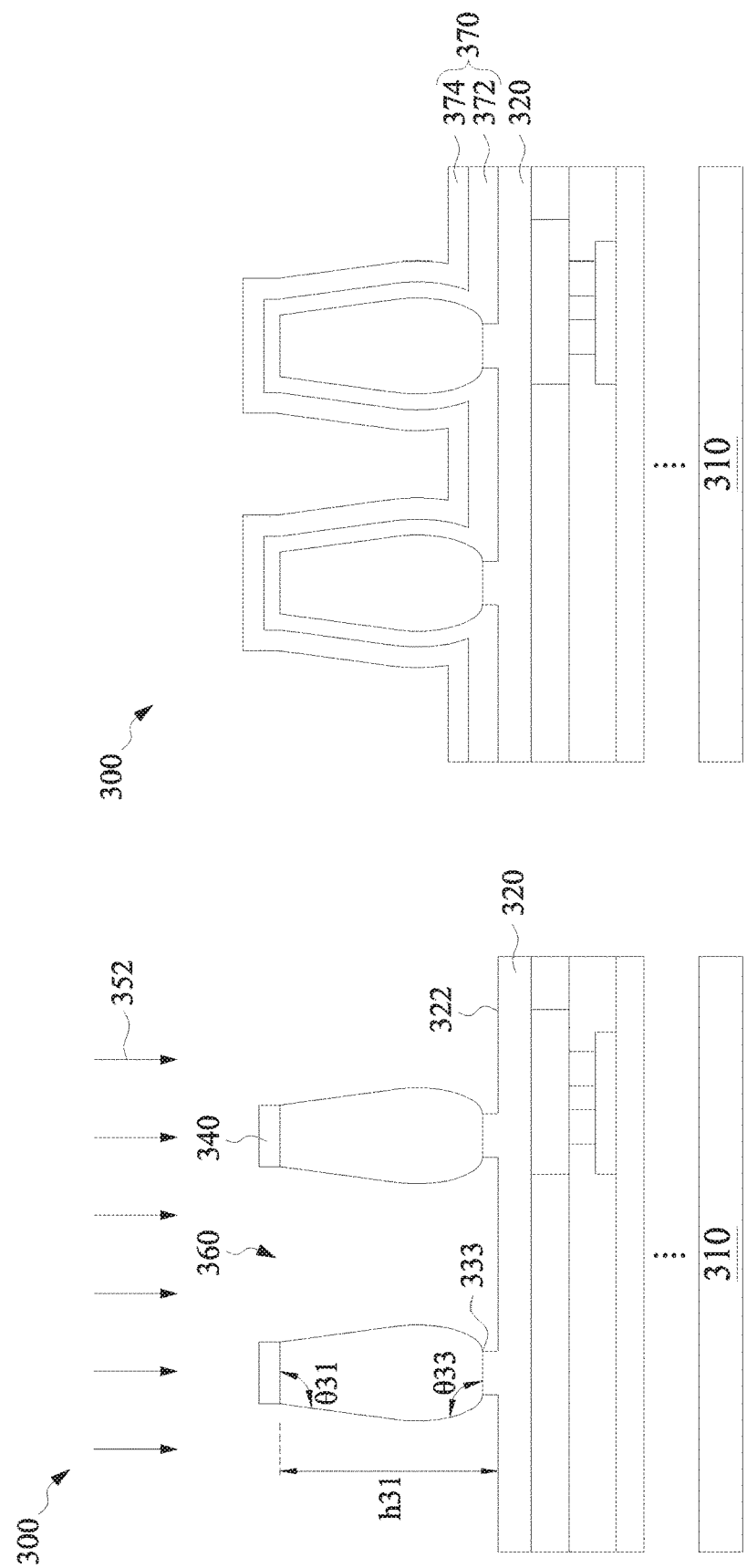

POST PASSIVATION INTERCONNECT AND FABRICATION METHOD THEREFOR

PRIORITY CLAIM

The instant application is a non-provisional application claiming priority to Provisional Application No. 62/427,786, filed Nov. 29, 2016, the entire content of which is incorporated by reference herein.

BACKGROUND

A semiconductor integrated circuit (IC) includes both active devices, such as transistors and diodes, and passive devices, such as resisters and capacitors. Devices are initially isolated from each other in a front-end-of-line (FEOL) process, and later coupled to each other in a back-end-of-line (BEOL) process in order to perform functional operations. The BEOL process includes fabrication of interconnect structures, such as conductive pads and bumps. Post passivation interconnects (PPI) are used to connect the conductive pads with the bumps. Electrical connections are made through the conductive pads to connect the die to a substrate or another die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional views at various stages of fabrication a semiconductor device in accordance with one or more embodiments.

DETAILED DESCRIPTION

Figure 1:
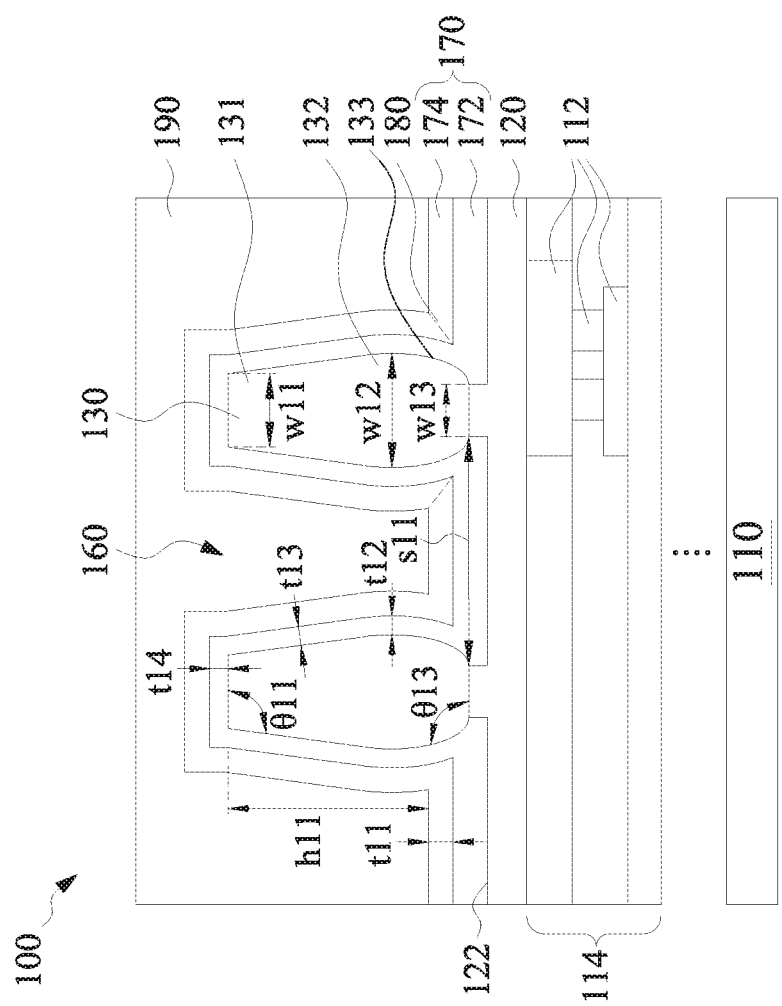
FIG. 1 is a cross-sectional view of a semiconductor device having a PPI in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

As semiconductor technology evolves, a geometrical size of interconnect structures decreases to increase IC density, lower manufacturing cost and improve device performance. The interconnect structures include lateral interconnections, such as metal lines (wirings), and vertical interconnections, such as contacts and via plugs. The metal lines and via plugs are formed in inter-metal dialectic (IMD) layers. On top of IMD layers, conductive pads are formed and connected to bumps through the PPI, also referred to as a redistribution line (RDL). In some embodiments, the bumps include solder bumps, copper pillars, or other suitable bumps. One type of semiconductor packaging is a wafer level chip scale packaging (WLCSP), in which a die is packaged in a way that uses the PPI structures to fan out electrical connections for conductive pads to rewire and reposition external terminals at desired locations.

A first insulating layer is formed to isolate the topmost metal line in the IMD layer from the PPI and a second insulating layer is formed to protect the PPI from moisture and ions, such as sodium ions, entering and diffusing into the PPI from the external environment. With smaller process geometries, a control of a step coverage and a conformity of the second insulating layer is more difficult, thereby increasing a risk of a crack generating at an interface of a sidewall portion and a bottom portion of the second insulating layer. Additionally, the smaller geometry makes the PPI more susceptible to collapsing during subsequent processes. Therefore, the production yield is sensitive to the step coverage and the conformity of the second insulating layer.

In some embodiments, a profile of the PPI has a barrel shape. That is, a body portion of the PPI is wider than both an upper portion and a bottom portion of the PPI. In some embodiment, the barrel shape is formed by multiple etch processes. For example, an anisotropic etch process is followed by an isotropic etch process. An undercut at the bottom portion of the PPI of the barrel shape improves step coverage and conformity of the second insulating layer as well as the quality and reliability of the device. In some embodiments, a profile of the PPI has a trapezoidal shape. The step coverage and conformity of the second insulating layer is improved in comparison with other PPI structures because a sidewall of the bottom portion of the PPI has an obtuse angle with respect to the top surface of the passivation layer.

FIG. 1 is a cross-sectional view of a semiconductor device 100 in accordance with one or more embodiments. Semiconductor device 100 includes a substrate 110, interconnect structures 112, IMD layers 114, a first insulating layer 120, at least one PPI 130, a second insulating layer 170, and a polymer layer 190. In some embodiments, substrate 110 includes silicon, III-V compounds or other bulk semiconductor material. In some embodiments, substrate 110 is a silicon on insulator layer (SOI) substrate or a silicon on sapphire (SOS) substrate. Substrate 110 includes an electrical circuitry (not shown). In some embodiments, a plurality of fin structures extends from substrate 110. In some embodiments, contact plugs (not shown), an inter-layer dielectric (ILD) (not shown) and interconnect structures 112 are formed over substrate 110. Interconnect structures 112 include metal lines and via plugs, which are formed in IMD layers 114. In some embodiments, the metal lines or the via plugs include at least one of aluminum, copper, copper alloy, tungsten, gold or another suitable conductive material. In some embodiments, IMD layers 114 include a low-k dielectric material, which has a dielectric constant lower than 3, or an extreme low-k (ELK) dielectric material, which has a dielectric constant lower than 2.6. In some embodiments, a combination of metal lines formed in same IMD layer 114 is referred to as a metal layer at a same level. The metal lines at different levels are electrically connected through the via plugs to each other, and through the contact plugs to the electrical circuitry.

A first insulating layer 120 is over IMD layers 114. First insulating layer 120 is also referred to as a first passivation layer or passivation layer 1 (PASS1). In some embodiments, first insulating layer 120 includes a single dielectric material, such as silicon dioxide. In some embodiments, first insulating layer 120 includes composite dielectric materials, such as a combination of undoped silicate glass (USG) and silicon nitride. In some embodiments, a thickness of first insulating layer 120 ranges from about 700 nanometers (nm) to about 1200 nm. For example, first insulating layer 120 includes a 75 nm silicon nitride and an 850 nm USG. Because first insulating layer is used to protect interconnect structures 112 and the electrical circuitry from damage and contamination, a smaller thickness reduces the protection function, in some instances. However, a greater thickness increases manufacturing cost without a significant increase in protection, in some instances. In some embodiments, first insulating layer 120 includes recesses 122 exposed in a trench 160. In some embodiments, a depth of recesses 122 ranges from 50 nm to about 400 nm. A greater depth reduces the protection function of first insulating layer 120, in some instances. In at least one embodiment, PPI via plugs (not shown) are formed in first insulating layer 120 to electrically connect contact pads and a topmost metal line of interconnect structures 112.

Two or more PPIs 130 are over first insulating layer 120. In some embodiments, PPI(s) 130 electrically connect to corresponding contact pads and bumps. In some embodiments, considering a coefficient of thermal expansion of a die, a greater density of conductive features helps prevent warping in a subsequent thermal process. In some embodiments, at least some PPIs 130 are dummy PPIs not connected to a contact pad or a bump. PPI 130 includes at least aluminum, copper, aluminum-copper, gold, tungsten or another suitable conductive material. In some embodiments, PPI 130 includes a same material as interconnect structures 112. In some embodiments, PPI 130 includes a different material from interconnect structures 112. For example, PPI 130 includes aluminum and interconnect structures 112 include copper. Adding copper into PPI 130 and/or interconnect structures 112 helps reduce electromigration (EM) caused by electrons, in some instances. In some embodiments, an anti-reflective layer, such as titanium nitride or tantalum silicon nitride, is over PPI 130. In some embodiments, the bumps are arranged in a ball grid array (BGA). In some embodiments, the contact pad includes at least aluminum, copper, aluminum-copper or another suitable conductive material. An under-bump metallurgy (UBM) structure is between PPI 130 and the bump. In some embodiments, the UBM structure extends beyond an edge of the bump along a direction parallel to a top surface of PPI 130. In some embodiments, the UBM structure directly connects to PPI 130.

In some embodiments, a profile of PPI 130 has a barrel shape. That is, a width w11 of an upper portion 131 and a width w13 of a bottom portion 133 are both smaller than a width w12 of a body portion of PPI 130. An undercut is formed at a corner between bottom portion 133 and a top surface of first insulating layer 120. In some embodiments, width w11 ranges from about 0.75 micrometers (μm) to about 2 μm, width w12 ranges from about 1 μm to about 3 μm and width w13 ranges from 0.75 μm to about 2.5 μm. A greater width increases a chip size, in some instances. A smaller width increases a resistance of PPI 130, resulting in an increase in a resistive-capacitive (RC) time delay, in some instances. In some embodiments, PPI 130 has a height h11 ranging from about 1.5 μm to about 4.5 μm. A greater height h11 increases a difficulty of a subsequent gap-filling process and/or increases manufacturing cost without a significant improvement in enhancing an operating speed, in some instances. A smaller height h11 increases the resistance of PPI 130, in some instances. Each PPI 130 is separated from adjacent PPI(s) 130 by a minimum spacing s11 which is at bottom portion 133. In some embodiments, minimum spacing s11 is equal to or greater than 1 μm. A smaller spacing s11 also increases the difficulty of subsequent gap-filling process, in some instances. In some embodiments, a minimum spacing between body portions of adjacent PPIs 130 is around 0.9 μm. A smaller spacing between body portions also increases the difficulty of subsequent gap-filling process, in some instances. In such a way, an aspect ratio of PPI 130, which is based on height h11 and spacing s11, is at least 1.5, in some instances. In some embodiments, upper portion 131 has an upper angle θ11 ranging from about 100 degrees to about 110 degrees, and bottom portion 133 has a lower angle θ13 ranging from about 95 degrees to 105 degrees. Upper angle θ11 is between a sidewall and a top surface of PPI 130 and lower angle θ13 is between the sidewall and a bottom surface of PPI 130. A smaller or a greater angle increases a difficulty of controlling a conformity of a second insulating layer 170, especially a second dielectric layer 174, in subsequent process(es), in some instances. For example, a smaller upper angle θ11 increases a risk of an overhang around upper portion 131. In some embodiments, a profile of PPI 130 has a trapezoidal shape with tapered sidewalls. Various profiles of PPI 130 are discussed below in more detail in association with cross-sectional views corresponding to the operations of the flow diagram.

Second insulating layer 170 is over PPI 130 and first insulating layer 120. In some embodiments, second insulating layer 170 is referred to as a second passivation layer or passivation layer 2 (PASS2). Second insulating layer 170 includes a first dielectric layer 172 and second dielectric layer 174. In some embodiments, first dielectric layer 172 includes silicon oxide, silicon oxynitride, tetraethoxysilane (TEOS) oxide or another suitable material. In some embodiments, first dielectric layer 172 includes composite materials. For example, a silicon rich oxide liner and a silicon dioxide layer. In some embodiments, second dielectric layer 174 includes silicon nitride, silicon oxynitride or another suitable material. In some embodiments, first dielectric layer 172 includes a same material as second dielectric layer 174. In some embodiments, first dielectric layer 172 includes a different material from second dielectric layer 174. For example, first dielectric layer 172 is USG and second dielectric layer 174 is silicon nitride.

In some embodiments where first dielectric layer 172 is silicon oxide or silicon oxynitride, a thickness of first dielectric layer 172 ranges from about 0.6 μm to about 1.8 μm. In at least some embodiments, first dielectric layer 172 is used to protect PPI 130 and recover damages and charging effect. Therefore, a smaller thickness of first dielectric layer 172 reduces the protection function, in some instances. However, a greater thickness of first dielectric layer 172 increases manufacturing cost without providing a significant improvement in recovering from damage or charging effect, in some instances. Also, a greater thickness of first dielectric layer 172 increases a difficulty of subsequent gap-filling process, especially at minimum pitch in a design rule, in some instances. In a thin film process, a conformity is a ratio determined by a smallest sidewall thickness t13 to a greatest thickness t12. In some embodiments, the conformity of the first dielectric layer 172 is equal to or greater than 75%. In addition, a sidewall step coverage is a ratio determined by an average sidewall thickness and a thickness t14 over PPI 130. In some embodiments, the sidewall step coverage of first dielectric layer 172 is equal to or greater than 75%. A bottom step coverage is a ratio determined by thickness t14 to a thickness t11 over first insulating layer 120. In some embodiments, the bottom step coverage of first dielectric layer 172 is equal to or greater than 75%. A smaller bottom step coverage of first dielectric layer 172 negatively affects a step coverage of second dielectric layer 174, in some instances.

In some embodiments where second dielectric layer 174 is silicon nitride, a thickness of second dielectric layer 174 ranges from about 0.35 µm to about 1.05 µm. In some embodiments, second dielectric layer 174 is used to prevent moisture and mobile ions from entering PPI 130. Therefore, a smaller thickness of second dielectric layer 174 increases contamination of moisture and/or mobile ions, in some instances. However, a greater thickness also increases a difficulty of subsequent gap-filling process, in some instances. In some embodiment, a conformity of second dielectric layer 174 ranges from about 75% to about 85%, a sidewall step coverage ranges from about 75% to about 85%, and a bottom step coverage ranges from about 60% to about 80%. Due to an improve conformity and step coverage, an interface between a sidewall of second dielectric layer 174 and a bottom portion close to first insulating layer 120 has a reduced risk of cracking. A dashed line in FIG. 1 indicates a likely location for a crack 180 in other semiconductor devices.

Polymer layer 190 is over second insulating layer 170 and in trench 160. In some embodiments, polymer layer 190 includes epoxy, polymide, benzocyclobutene (BCB), polybenzoxazole (PBO), or another suitable material. In some embodiments, polymer layer 190 is photo-sensitive or non-photo-sensitive. In some embodiments, a thickness of polymer layer 190 ranges from about 4.5 µm to about 15 µm. Because polymer layer 190 is used to protect the electrical circuitry, interconnect structures, and/or PPI 130 from moisture, mechanical and radiation damage, a smaller thickness reduces a protection of the electrical circuitry and PPI 130, in some instances. However, a greater thickness reduces a thermal conductivity of polymer layer 190, which increases a risk of damage to semiconductor device 100 due to overheating, in some instances.

Figure 2:
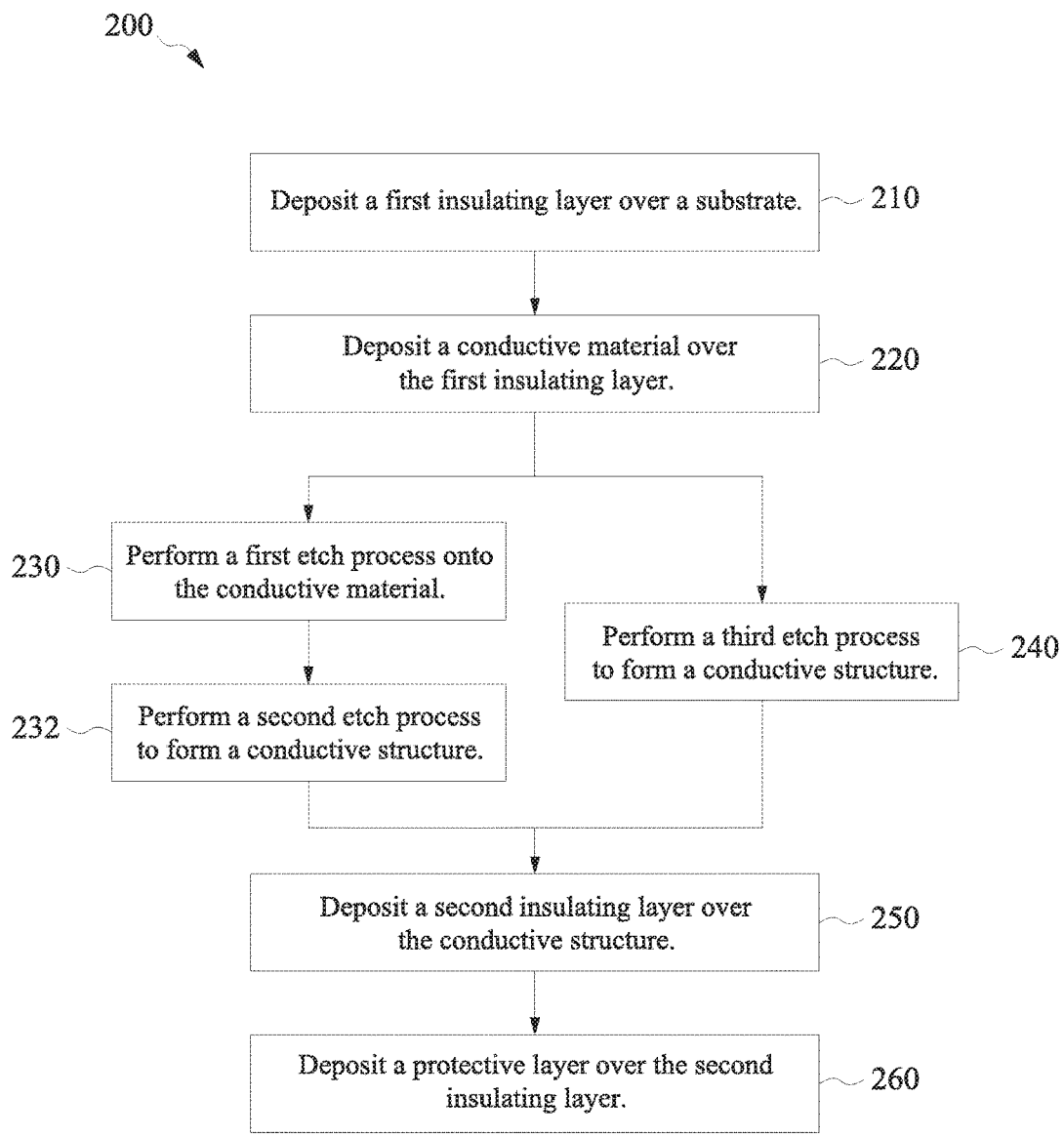
FIG. 2 is a flow chart of a method of fabricating a PPI in accordance with one or more embodiments.

FIG. 2 is a flowchart of a method 200 of fabricating a semiconductor device in accordance with one or more embodiments. One of ordinary skill in the art would understand that additional operations are able to be performed before, during, and/or after method 200 depicted in FIG. 2, in some embodiments. Additional details of the fabricating process are provided below with respect to FIGS. 3A-3D and 4A-4B, in accordance with some embodiments.

Method 200 includes operation 210 in which a first insulating layer is deposited over a substrate, e.g., first insulating layer 120 over substrate 100 in FIG. 1. In some embodiments, the first insulating layer includes one or more layers, such as oxide, tetraethoxysilane (TEOS), USG, fluorinated silicon glass (FSG), phosphosilicate glass (PSG), boron-doped silicate glass (BSG), boron-phosphor-doped silicate glass (BPSG), silicon nitride, silicon carbide or silicon oxynitride. The formation of the first insulating layer includes a deposition process, such as chemical vapor deposition (CVD), physical vapor deposition (PVD), atomic layer deposition (ALD), thermal oxidation or another suitable process. In some embodiments wherein the first insulating layer includes more than one material, the formation of each material includes a same or different deposition processes.

Method 200 continues with operation 220 in which a conductive material is deposited over the first insulating layer, e.g., first insulating layer 120 in FIG. 1. In some embodiments, the conductive material includes aluminum, aluminum alloys, copper, copper alloys, aluminum-copper, titanium, nickel or another suitable material. The formation of the conductive material includes a deposition process, such as CVD. In some embodiments, the formation of the conductive material includes sputtering, evaporation, electrolytic plating, electro-chemical plating (ECP), electroless plating or printing. In some embodiments, the conductive material includes multiple components by using an adhesion material, such as titanium, chromium or titanium tungsten. One of ordinary skill in the art would understand that, in order to electrically connect a topmost metal line in the IMD layers, e.g., IMD layers 114 in FIG. 1, and a contact pad (I/O pad), at least one PPI via plug is formed in an opening in the first insulating layer. The opening in the first insulating layer is made by removing a portion of the first insulating layer using a photoresist defined etch process to expose at least a portion of a topmost metal line or contact pad. The formation of the at least one PPI via plug includes a photolithography process, an etch process and a deposition process.

Method 200 continues with an optional operation 230 in which a first etch process is performed onto the conductive material. The first etch process helps to define a PPI from the conductive material. A mask layer such as a photoresist is patterned to determine a pattern of the PPI and to protect the PPI during the etch process. A trench is formed between the adjacent PPIs during the first etch process, e.g., trench 160 between adjacent PPIs 130 in FIG. 1. In some embodiments, an upper portion of the PPI is formed to have an upper angle between a sidewall and a top surface of the PPI and extending away from a center of the PPI. In some embodiments, the upper angle ranges from about 100 degrees to about 110 degrees. In some embodiments, the upper portion has a rounded corner. In some embodiments, a body portion of the PPI is also formed during the first etch process. In some embodiments, the first etch process is an anisotropic etch process. In some embodiments, the anisotropic etch process is a dry etching or a plasma-assisted etching, such as reactive ion etch (RIE), high density plasma (HDP) etching, transformer coupled plasma (TCP), inductively coupled plasma (ICP), cyclotron resonance (ECR), capacitively coupled plasma (CCP) or sputter etching. In some embodiments, the anisotropic etch process is a wet etching.

The plasma-assisted etching includes a chemical reaction by radicals and ions and a physical bombardment onto a process surface. The chemical reaction occurs between an etchant and the process surface, with or without plasma, while a volatile product is pumped away. In some embodiments where the first etch process is RIE, an injected gas, includes $CCl_4$, $BCl_3$, $B_2Cl_6$, BBr3, $Cl_2$, HCl, HBr, $CF_4$, or the like, an etchant flow from about 20 sccm to 200 sccm and at a pressure ranges from about 50 mTorr to about 300 mTorr. The etchant gas is ionized through a dissociative process by plasma. In some embodiments, the plasma is generated from a first electrode plate with a radio frequency (RF) source power ranging from about 50 to about 2000 watts and the bias power of a second electrode plate is in a range from about 50 watts to about 1000 watts. An etching behavior is affected by various process parameters such as RF power and bias power. For example, when a ratio of RF power/bias power is lower, the physical bombardment increases, resulting in a more anisotropic etching behavior. In contrast, a higher ratio of RF power/bias power results in a more isotropic etching behavior.

In some embodiments, the etching behavior is determined by a plasma/radical ratio. The injected gas rarely reacts with the process surface that has been etched while free radicals are the major reactant species. Therefore, a relatively higher plasma/radical ratio generates more ions so that an efficiency of the physical ion bombardment is greater than the chemical reaction by the radicals.

Next, following operation 230, method 200 continues with operation 232 in which a second etch process is performed to form a conductive structure, e.g., PPI 130 in FIG. 1. The PPI is formed to have a barrel shape during the second etch process. In some embodiments, a body portion of the PPI is formed during the second etch process. In some embodiments, the bottom portion of the PPI has a lower angle, which is between the top surface of the first insulating layer and a sidewall of the bottom portion, toward the center of the PPI in a range from about 95 degrees to 105 degrees. In some embodiments, the second etch process is an isotropic etch process. In some embodiments, the second etch process is a wet etching. In some embodiments, the second etch process is a plasma-assisted etching. In some embodiments, the first etch process uses a same technique as the second etch process. In some embodiments, the first etch process uses a different technique from the second etch process. For example, the first etch process is an argon sputtering and the second etch process is a plasma-assisted etching. Other inert gas or other gas mixtures which would not react with the PPI may be used, in some instances. As another example, the first etch process uses a plasma-assisted etching and the second etch process uses a wet etching.

In some embodiments where the second etch process is a plasma-assisted etching, such as RIE, a ratio of RF power/bias power of the second etch process is smaller than a ratio of RF power/bias power of the first etch process. In such a way, the first etch process has a relatively greater physical ion bombardment than chemical radical reaction, and the second etch process has a relatively greater chemical radical reaction than physical ion bombardment, thereby resulting in a more anisotropic etching behavior than an isotropic etching behavior during the first etch process, and a more isotropic etching behavior than an anisotropic etching behavior during the second etch process. In some embodiments, a ratio of plasma/radical of the first etch process is higher than a ratio of plasma/radical of the second etch process. As a result, the first etch process is similar to anisotropic etching because of a relatively greater physical ion bombardment, and the second etch process is similar to isotropic etching because of a relatively greater chemical reaction.

In some embodiments, because a greater pressure increases a mean free path of ions in the plasma, which decreases the physical ion bombardment energy transferred to the process surface, the first etch process is performed at a relatively lower pressure than the second etch process.

In at least one embodiment where the PPI includes aluminum and the first etch process is a wet etching, an etching solution includes hot (from about 40 degrees Celsius to about 50 degrees Celsius) $H_3PO_4$, $CH_3COOH$, $HNO_3$ and $H_2O$.

In some embodiments, after the first etch process, a polymer material is formed along sidewalls and a bottom surface of the trench and a top surface of the PPI. In some embodiments, the polymer material is blanket deposited to cover sidewalls of the trench. In some embodiments, the polymer material is formed by a plasma process using a carbon-rich hydrofluorocarbon plasma, such as difluoromethane. In some embodiments, a thickness of the polymer material ranges from about 10 nm to about 50 nm. Afterward, a portion of polymer material is removed from the top surface of the PPI and from the bottom surface of the trench. The polymer remains along the sidewalls of the trench. Next, the second etch process is performed to cause a barrel shape. The sidewall polymer is then stripped using an oxygen plasma, in some embodiments.

In at least one embodiment, a top portion of the first insulating layer is removed during the second etch process and a recess is formed to have a depth in range from about 50 nm to about 200 nm.

Figures 4A, 4B:
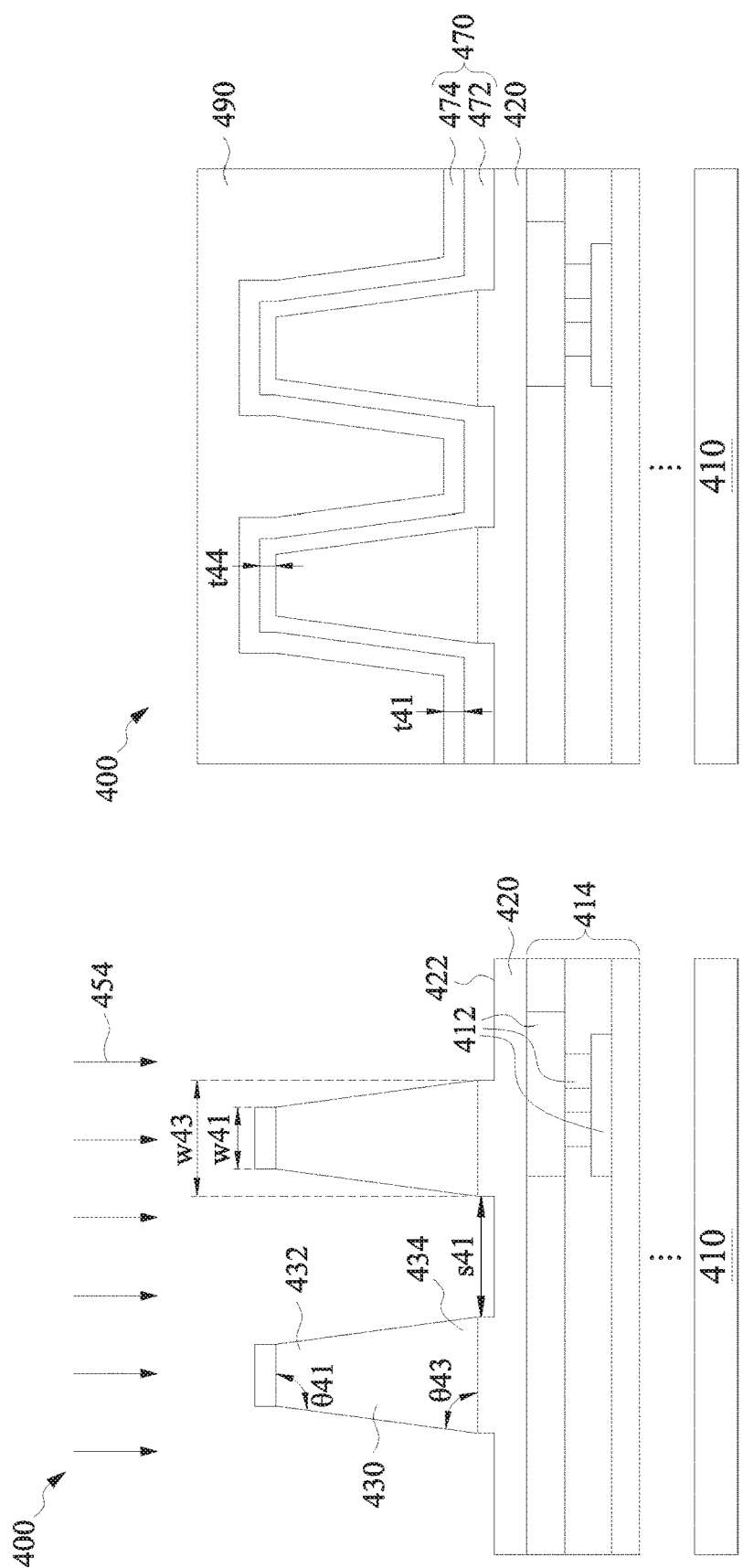
FIGS. 4A-4B are cross-sectional views at various stages of fabrication a semiconductor device in accordance with one or more embodiments.

Alternatively, following operation 220, method 200 continues with operation 240 in which a third etch process, e.g., etch process 454 in FIG. 4A, is performed to form a conductive structure. The conductive structure, also referred to as the PPI, has a trapezoidal shape with tapered sidewalls. A width of an upper portion is smaller than a width of a bottom portion of PPI. In some embodiments, the third etch process is an anisotropic etch process. In some embodiments, the third etch process is a combination of an anisotropic etch process and an isotropic etch process. In some embodiments, the upper portion of the PPI has an upper angle ranging from about 95 degrees to about 105 degrees. The upper angle is between a top surface and a sidewall of the PPI. A smaller upper angle increases a difficulty of controlling the conformity of the second dielectric layer in a subsequent process, in some instances. A greater upper angle increases a risk of generating voids in the trench, in some instances.

Following operation 232 or operation 240, method 200 continues with operation 250 in which a second insulating layer is deposited over the conductive structure, e.g., second insulating layer 170 in FIG. 1. The second insulating layer partially fills the trench between the conductive structures. In some embodiments, the second insulating layer includes a first dielectric layer, e.g., first dielectric layer 172 in FIG. 1, and a second dielectric layer, e.g., second dielectric layer 174 in FIG. 1. In some embodiments, the first dielectric layer includes silicon oxide, TEOS, USG, PSG, silicon oxynitride, silicon nitride or another suitable material. In some embodiments, the first dielectric layer uses a same material as the first insulating layer. In some embodiments, the second dielectric layer includes silicon nitride, silicon oxynitride, silicon carbide or another suitable material. In some embodiments, the second dielectric layer uses a same material as the first dielectric layer. In some embodiments, the second dielectric layer is different from the first dielectric layer. The formation of the second insulating layer includes a deposition process, such as CVD, PVD, ALD, thermal oxidation or another suitable process. In some embodiments where the deposition process is CVD, the second insulating layer is formed by using a plasma-enhanced CVD (PECVD), high-density plasma CVD (HDPCVD) or low-pressure CVD (LPCVD). In some embodiments, the formation of the first dielectric layer uses a same technique as the second dielectric layer. In some embodiments, the formation of the first dielectric layer uses a different technique from the second dielectric layer. In some embodiments, the second insulating layer is patterned to cover a peripheral portion of the contact pad and to expose a center portion of the contract pad. In some embodiments, the second insulating layer includes more than two dielectric materials.

Method 200 continues with operation 260 in which a protective layer is deposited over the second insulating layer, e.g., polymer layer 190 over second insulating layer 170 in FIG. 1. The protective layer is formed over the second insulating layer and fills the trench between the PPIs. The formation of the protective layer includes a deposition process, electromagnetic compatibility (EMC) coating, spin coating or another suitable process. In some embodiments, the protective layer includes epoxy, polyimide, BCB, PBO or another suitable material. In some embodiments, the protective layer includes a soft, organic material.

In some embodiments, additional operations are included in method 200, such as forming the conductive structure by using a fourth etch process before or after the second etch process. In some embodiments, multiple operations for method 200 are performed simultaneously. For example, in some embodiments operation 230 and operation 232 are performed simultaneously.

FIGS. 3A-3D are cross-sectional views of a semiconductor device 300 during various stages of processing in accordance with some embodiments. FIG. 3A is a cross-sectional view of semiconductor device 300 following operation 220. Semiconductor device 300 includes elements similar to semiconductor device 100 and a last two digits of like elements are the same. Semiconductor device 300 includes a substrate 310, interconnect structures 312, IMD layers 314, a first insulating layer 320 and a conductive material 330'. In some embodiments, a diffusion barrier layer is formed between first insulating layer 320 and conductive material 330'.

FIG. 3B is a cross-sectional view of semiconductor device 300 following operation 230. A mask layer 340 such as a photoresist is formed over conductive material 330' to pattern PPIs 330 and/or the conductive pad. During a first etch process 350, an opening of trench 360 is formed between PPIs 330 and an upper portion 331 of PPI 330 is formed to have a height h31'. In some embodiments, a body portion 332 of PPI 330 is partially or fully formed during first etch process 350.

FIG. 3C is a cross-sectional view of semiconductor device 300 following operation 232. A bottom portion 333 of PPI 330 is formed during a second etch process 352. In some embodiments, PPI 330 has a height h31 ranging from about 1.2 to about 2 times than height h31'. A greater height h31 increases a difficulty of a subsequent gap-filling process, in some instances. A smaller height h31 increases a quantity of defects around bottom portion 333, resulting in a low production yield, in some instances. A recess 322 is formed in first insulating layer 320 during second etch process. In some embodiments, when mask layer 340 is the photoresist an oxygen plasma ashing process is performed to expose the top surface of PPI 330 following second etch process 352. In at least one embodiment, where second etch process 352 is a plasma-assisted etching, mask layer 340 is removed and bottom portion 33 is formed simultaneously during second etch process 352.

FIG. 3D is a cross-sectional view of semiconductor device 300 following operation 250. A second insulating layer 370 is formed over PPI 330 and first insulating layer 320. In some embodiments, second insulating layer 370 includes a first dielectric layer 372 and a second dielectric layer 374. In some embodiments, a bottom surface of PPI 130 and a bottom surface of first dielectric layer 372 is between a top surface and a bottom surface of first dielectric layer 372. Because a width of bottom portion 333 is reduced in comparison with a body portion of PPI 330, a spacing at a bottom portion of trench 360 is relatively wider during a formation of second dielectric layer 374, resulting in an improved conformity of second dielectric layer 374. Further, due to the improved conformity of second dielectric layer 374, a step coverage at an interface between a bottom portion and sidewall of second dielectric layer 374 is improved and a risk of cracks in second dielectric layer 372 is reduced with respect to other approaches.

FIGS. 4A-4B are cross-sectional views of a semiconductor device 400 during various stages of processing in accordance with some embodiments. FIG. 4A is a cross-sectional view of semiconductor device 400 following operation 240. Semiconductor device 400 includes elements similar to semiconductor device 100 and a last two digits of like elements are the same. Semiconductor device 400 includes a substrate 410, interconnect structures 412, IMD layers 414, a first insulating layer 420, recesses 422, PPIs 430, second insulating layer 470 and polymer layer 490. PPI 430 includes an upper portion 432 and a bottom portion 434. Second insulating layer 470 includes a first dielectric layer 472 and a second dielectric layer 474.

In some embodiments, PPI 430 is formed by an etch process 454. Etch process 454 includes a dry etching and/or a wet etching. In some embodiments, a profile of PPI 430 has a trapezoidal shape. A width w43 is greater than a width w41. Because an upper angle θ41 and a lower angle θ43 are supplementary angles, upper angle θ41 and lower angle θ43 add up to 180 degrees. Therefore, lower angle θ43 is in a range from about 75 degrees to about 85 degrees. In some embodiments, each PPI 430 is separated from adjacent PPI(s) by a minimum spacing s41 at bottom portion 434. In some embodiments, minimum spacing s41 is equal to or greater than 1 μm. A bottom step coverage is a ratio determined by thickness t44 to a thickness t41 over first insulating layer 420. In some embodiments, the bottom step coverage of first dielectric layer 472 is equal to or greater than 75%.

By adjusting the profile of the PPI, a conformity and sidewall step coverage of the second dielectric layer is improved with respect to other approaches, thereby reducing a risk of generating a crack near a bottom portion of a PPI. In at least one approach, the profile is determined by the etching behavior when manufacturing the interconnect structure. Moreover, the improved sidewall conformity and sidewall step coverage provides more choices of equipment/apparatus, resulting in a reduced manufacturing cost and increased production yield.

One aspect of this description relates to a method of manufacturing a semiconductor structure. The method includes depositing a conductive material over a substrate, and removing a portion of the conductive material to form a conductive structure having a barrel shape, wherein a width of a body portion of the conductive structure is greater than a width of an upper portion and a width of a bottom portion of the conductive structure.

Another aspect of this description relates to a method of manufacturing a PPI. The method includes depositing a first passivation layer over a substrate, depositing a conductive material over the first passivation layer, etching the conductive material to form at least two conductive lines, wherein the etching operation has two etching steps and a pressure of a first etching step is lower than a pressure of a second etching step, depositing a second passivation layer over the at least two conductive lines, and depositing a polymer layer over the second passivation layer Still another aspect of this description relates to an IC device. The IC device includes a first passivation layer over a substrate, a redistribution line over the first passivation layer, a second passivation layer over the redistribution line, and a polymer layer over the second passivation layer, wherein the redistribution line has a barrel-shaped profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    depositing a conductive material over a substrate; and
    removing a portion of the conductive material to form a conductive structure having a barrel shape, wherein a width of a body portion of the conductive structure is greater than a width of an upper portion and a width of a bottom portion of the conductive structure, and an entirety of a sidewall of the conductive structure has a curved convex surface.

2. The method of claim 1, wherein removing the portion of the conductive material comprises:
    performing an anisotropic etching process to form an upper portion of the conductive structure, wherein the upper portion of the conductive structure has a trapezoidal shape; and
    performing an isotropic etching process to form a bottom portion of the conductive structure, wherein the bottom portion of the conductive structure has an undercut.

3. The method of claim 2, wherein performing the isotropic etching process comprises performing a wet etching.

4. The method of claim 1, wherein removing the portion of the conductive material comprises:
    performing a first reactive ion etching (RIE) process to form an upper portion of the conductive structure; and
    performing a second RIE process to form a bottom portion of the conductive structure, wherein a radical/plasma ratio of the first RIE process is greater than a radical/plasma ratio of the second RIE process.

5. The method of claim 1, wherein removing the portion of the conductive material comprises:
    performing a first plasma etching process to form an upper portion of the conductive structure; and
    performing a second plasma etching process to form a bottom portion of the conductive structure, wherein a RF power/bias power ratio of the second plasma etching process is greater than the first plasma etching process.

6. The method of claim 1, further comprising:
    forming a polymer material along sidewalls of the unremoved portion of the conductive material.

7. The method of claim 1, further comprising:
    depositing a first insulating layer over the substrate; and
    depositing a second insulating layer over the conductive structure, wherein a recess is formed in the first insulating layer during the removing operation.

8. The method of claim 7, wherein depositing the second insulating layer comprises:
    forming the recess to have a depth in a range from about 50 nanometers (nm) to about 200 nm.

9. The method of claim 7, wherein depositing the second insulating layer comprises:
    depositing a first dielectric layer along a top surface and sidewalls of the conductive structure, and a top surface of the recess; and
    depositing a second dielectric layer along the first dielectric layer, wherein a sidewall step coverage of the second dielectric layer ranges from about 75% to about 85%.

10. The method of claim 7, wherein depositing the second insulating layer comprises:
    depositing a first dielectric layer along a top surface and sidewalls of the conductive structure, and a top surface of the recess; and
    depositing a second dielectric layer along the first dielectric layer, wherein a conformity of the second dielectric layer ranges from about 75% to about 85%.

11. A method of manufacturing a post passivation interconnect (PPI), comprising:
    depositing a first passivation layer over a substrate;
    depositing a conductive material over the first passivation layer;
    etching the conductive material to form at least two conductive lines, wherein the etching operation has two etching steps and a pressure of a first etching step is lower than a pressure of a second etching step;
    depositing a second passivation layer over the at least two conductive lines; and
    depositing a polymer layer over the second passivation layer.

12. The method of claim 11, wherein patterning the conductive material comprises:
    removing a portion of the conductive material to form the at least two conductive lines to have a barrel shape, wherein a width of a body portion of the at least two conductive lines is greater than a width of an upper portion of the at least two conductive lines and a width of a lower portion of the at least two conductive lines.

13. The method of claim 12, wherein removing the portion of the conductive material comprises:
    forming an upper portion of the at least two conductive lines to have an upper angle ranging from about 100 degrees to about 110 degrees, and a lower portion of the at least two conductive lines to have a lower angle ranging from about 95 degrees to 105 degrees, wherein the upper angle is between a top surface and a sidewall of each of the at least two conductive lines and the lower angle is between the sidewall and a bottom surface of each of the at least two conductive lines.

14. The method of claim 11, wherein etching the conductive material comprises:

removing a portion of the conductive material to form the at least two conductive lines to form a trapezoidal shape.

15. The method of claim 11, wherein etching the conductive material to form the at least two conductive lines comprises:
forming the at least two conductive lines to have a height from about 0.75 times to about 3 times than a spacing between the at least two conductive lines.

16. The method of claim 11, wherein depositing the second passivation layer comprises:
depositing a first dielectric material over the at least two conductive lines; and
depositing a second dielectric material over the first dielectric material, wherein a bottom step coverage of the second dielectric material ranges from about 60% to about 80%.

17. The method of claim 16, wherein depositing the second dielectric material comprises:
depositing a silicon nitride to have a thickness in a range from about 0.35 micrometers (μm) to about 1.05 μm.

18. A method of manufacturing a semiconductor structure, comprising:
depositing a conductive material over a substrate;
anisotropically etching the conductive material to define a conductive material pattern in the conductive material, wherein the conductive material pattern has a first height from a top surface of the conductive material to a bottom surface of a recess formed by the anisotropic etching;
isotropically etching the conductive material pattern to define a post passivation interconnect, wherein the post passivation interconnect has a second height from a top surface of the post passivation interconnect to a bottom surface of a recess formed by the isotropic etching, and the second height is greater than the first height.

19. The method of claim 18, wherein the isotropically etching of the conductive material pattern comprises forming the recess extending into the substrate.

20. The method of claim 18, wherein the isotropically etching of the conductive material pattern comprises forming the post passivation interconnect having a rounded sidewall.

* * * * *